United States Patent [19]

Fan et al.

[11] Patent Number: 5,364,742
[45] Date of Patent: Nov. 15, 1994

[54] MICRO-MINIATURE STRUCTURES AND METHOD OF FABRICATION THEREOF

[75] Inventors: Long-Shen Fan; Hans H. Zappe, both of San Jose, Calif.

[73] Assignee: International Business Machines Corporation, Armonk, N.Y.

[21] Appl. No.: 948,189

[22] Filed: Sep. 21, 1992

[51] Int. Cl.$^5$ .......................... G03C 5/00; B44C 1/22
[52] U.S. Cl. ...................... 430/317; 430/311; 430/312; 430/313; 430/323; 430/324; 156/656; 156/657; 156/659.1; 156/662; 156/663
[58] Field of Search ................. 430/16, 273, 276, 313, 430/311, 312, 317; 156/656, 657

[56] References Cited

U.S. PATENT DOCUMENTS

| | | | |
|---|---|---|---|
| 4,614,119 | 9/1986 | Zavracky et al. | 73/704 |
| 4,663,275 | 5/1987 | West et al. | 430/271 |
| 4,677,049 | 6/1987 | Griffing et al. | 430/339 |
| 4,740,410 | 3/1988 | Muller et al. | 428/133 |
| 4,764,244 | 8/1988 | Chitty et al. | 156/630 |
| 4,889,795 | 12/1989 | Kaifu et al. | 430/326 |
| 4,925,770 | 5/1990 | Ichimura et al. | 430/273 |
| 4,942,113 | 7/1990 | Trundle | 430/326 |
| 5,025,346 | 6/1992 | Tang et al. | 361/283 |
| 5,106,723 | 4/1992 | West et al. | 430/325 |
| 5,108,874 | 4/1992 | Griffing et al. | 430/273 |
| 5,180,655 | 1/1993 | Sheats | 430/327 |
| 5,196,295 | 3/1993 | Davis | 430/273 |

FOREIGN PATENT DOCUMENTS 61-79226  4/1986  Japan .................. 430/312

OTHER PUBLICATIONS

W. C. Tang, et al., "Electrostatic-Comb Drive of Lateral Polysilicon Resonators", University of California at Berkeley, pp. 138–140.
L. Fan et al., "IC-Processed Electrostatic Micro-Motors", University of California–Berkeley, IEEE 1988, pp. 666–669.
D. K. Miu et al., "High-Bandwith Micro-Structures and Micro-Actuators for Super-High-Track-Density Magnetic Recording Computer Disk Drives", Feb. 1991, California.
Griffing et al., 0.4 μm Gate-Length Devices Fabricated by Contrast-Enhanced Lithography, IEEE Electron Device Letters, vol. EDL-4, No. 9 Sep., 1983 pp. 317–319.
Lyman et al., Lift-Off of Thick Metal Layers Using Multilayer Resist, J. Vac. Sci. Technol., 19(4), Nov./Dec. 1981 pp. 1325–1328.

*Primary Examiner*—Marion E. McCamish
*Assistant Examiner*—Bernard Codd
*Attorney, Agent, or Firm*—Baker, Maxham, Jester & Meador

[57] ABSTRACT

In the fabrication of a free-standing miniaturized structure in a range of about 10 to 20 μm thick, a method based on a sacrificial system includes the steps of selecting a substrate material, depositing on the substrate material a sacrificial layer of material and patterning the sacrificial layer to define a shape. A photoresist layer of material is deposited on the sacrificial layer and patterned by contrast-enhanced photolithography to form a photoresist mold. Upon the mold there is plated a metallic layer of material. The electroplated structure conforms to the resist profile and can have a thickness many times that of conventional polysilicon microstructures. The photoresist mold and the sacrificial layer are thereafter dissolved using etchants to form a free standing metallic structure in a range of about 10 to 20 μm thick, with vertical to lateral aspect ratios of 9:1 to 10:1 or more.

19 Claims, 9 Drawing Sheets

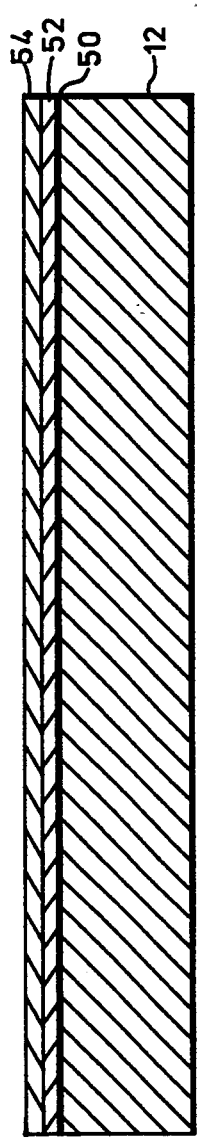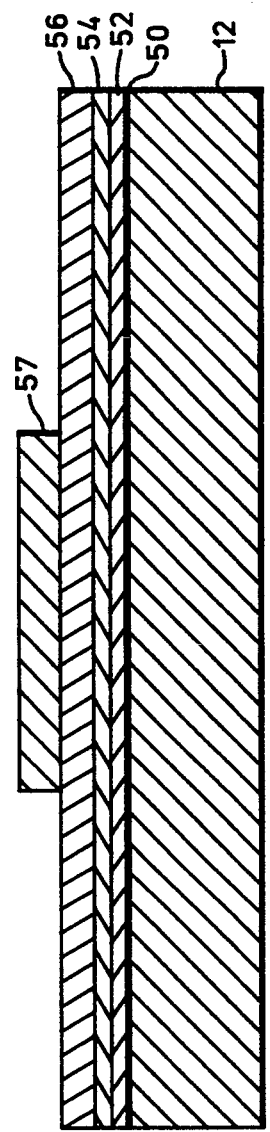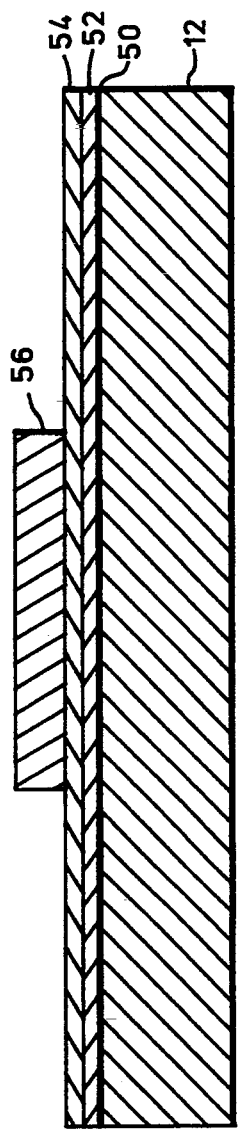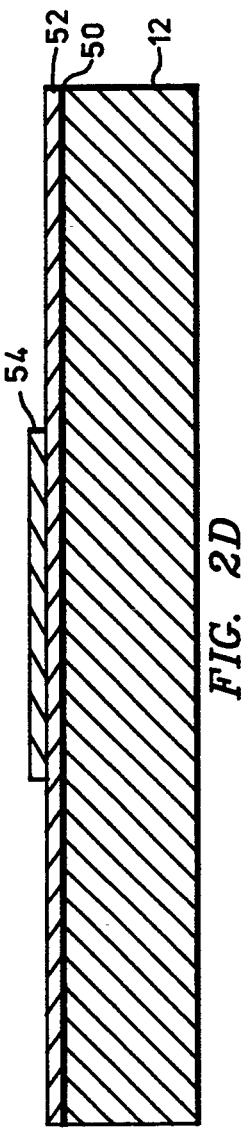

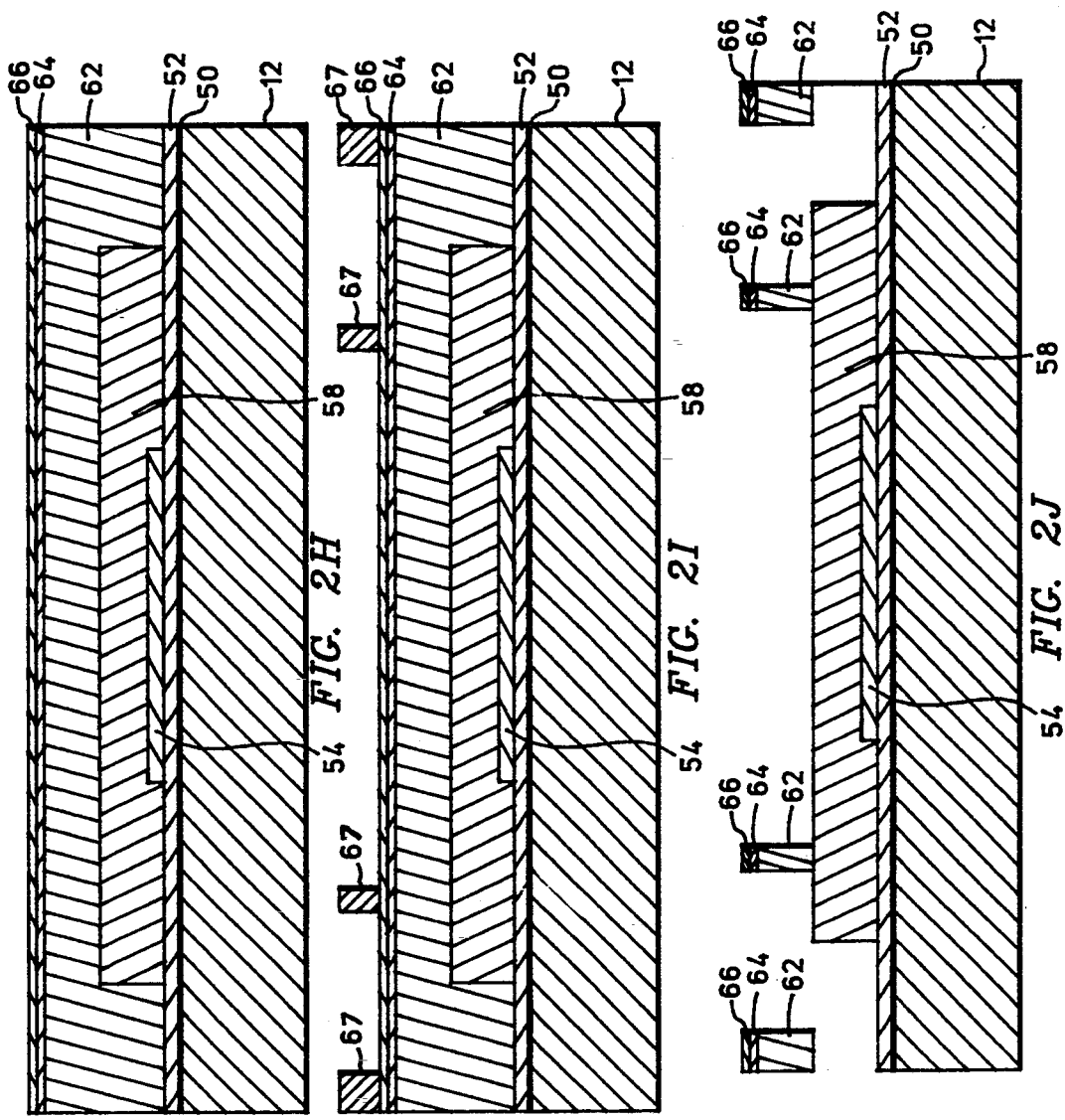

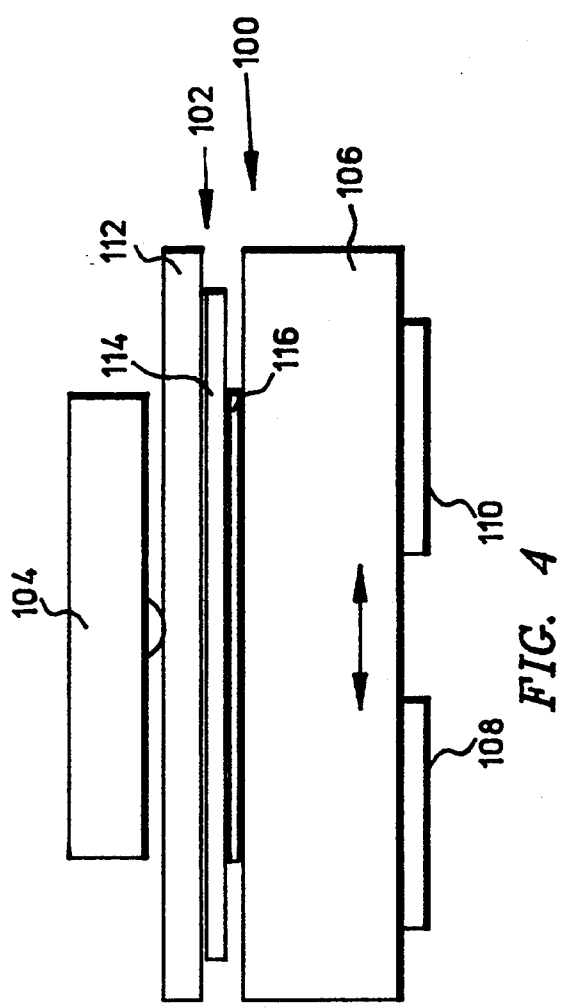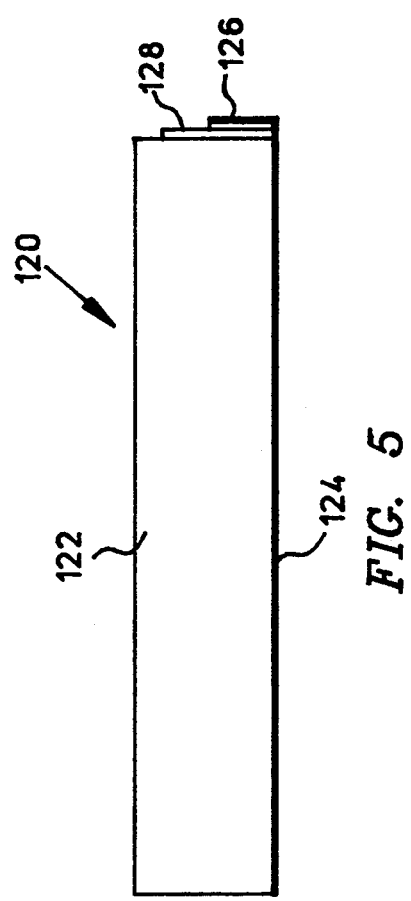

MICRO-MINIATURE STRUCTURES AND METHOD OF FABRICATION THEREOF

BACKGROUND OF THE INVENTION

The present invention relates generally to micromachining and microfabrication technology, and more particularly to the construction of integrated microminiature structures based on a departure from conventional thin-film polysilicon fabrication techniques.

Micro-technology encompasses a number of integrated microfabrication techniques derived from processes applicable to semiconductors and integrated circuits. These techniques include chemical etching, reactive ion etching, oxide etching, dry plasma etching, metallization, metal deposition, photolithography, thermal diffusion, ion implantation, and chemical vapor deposition. In recent years micromachining and microfabrication techniques have been used to advantage to provide a variety of active and passive microstructures in large quantities and at low cost. Among the many structures proposed are actuators and sensors, micro-motors and a variety of other devices including movable joints, levers, gears, sliders, springs and the like.

Historically, most of the surface-machined microstructures have been polysilicon-based. These structures are fabricated conventionally by chemical-vapor-deposited polycrystalline silicon films that are etched to produce structural layers on the order of 1–2 $\mu$m thick. These minimal thicknesses represent an inherent limitation of polysilicon-based structures which reduces their effectiveness in some applications. For example, polysilicon microactuators have been produced that are capable of generating constant forces on the order of sub-micro Newtons and torques on the order of sub-nano Newton-Meters. These devices can be used to move small objects at Mhz frequencies. On the other hand, it would be desirable to move objects having a size of one cubic millimeter or more at acceleration rates as high as 100G. For that purpose, forces on the order of milli-Newtons will be required. The fabrication of microstructures at this level requires a design providing sufficient vertical or out-of-plane rigidity, yet very low mechanical stiffness in the direction of acceleration such that the energy available for moving an object is maximized.

U.S. Pat. No. 5,025,346 proposes the construction of laterally driven resonant microactuator structures using polysilicon thin-film techniques in a sacrificial system. Fabrication is based on a four mask process wherein a 2 $\mu$m thick layer of polysilicon is deposited by low pressure chemical vapor deposition (LPCVD) over a sacrificial layer of phosphosilicate glass (PSG). Following appropriate patterning, the sacrificial layer is dissolved to yield a free standing actuator structure and suspension system. The suspension system includes a plurality of polysilicon beams that support the actuator for high frequency lateral movement in the plane of the structure. At a vertical thickness only 2 $\mu$m, however, very small vertical stiffness, that is, stiffness normal to the desired direction of acceleration, is provided by the suspension beams. This low vertical stiffness causes large vertical movements which are not desirable. Fortunately, as thickness in a given direction increases, the mechanical stiffness in that direction increases as a function of the cube of the thickness. On the other hand, stiffness in the orthogonal direction increases only linearly.

Thus, in microstructure applications, particularly those having free standing structures, it would be desirable to increase vertical structural thickness. This will require fabrication methods that overcome the thickness limitations of conventional thin film deposition techniques. Moreover, due to constraints on structural thickness in the direction of acceleration, techniques enabling the fabrication of structures having high aspect ratios (i.e., the ratio of vertical to lateral thickness) will be required. Although various x-ray techniques have been proposed for generating structures having thicknesses on the order of 100 $\mu$m, these thicknesses are much larger than necessary. Rather, it would be desirable to provide microstructures having vertical thicknesses on the order of 10 $\mu$m at an aspect ratio of about 10:1.

SUMMARY OF THE INVENTION

It is therefore a primary object and advantage of the invention to provide a method for the fabrication of free-standing miniaturized structures having vertical thickness on the order of 10 $\mu$m (between about 10 and 20 $\mu$m) at an aspect ratio of about 10:1 and which are thus free of the thickness constraints inherent in polysilicon thin-film techniques. This has been achieved through the use of alternative materials and an advanced lithographic and plating technique which permits thick-structure micromachining and an increase in structural thickness without sacrificing minimum in-plane features. In preferred aspects of the invention, we use a method based on a sacrificial system including the steps of selecting a substrate material, depositing on the substrate material a sacrificial layer of material and patterning the sacrificial layer to define a shape. A photoresist layer of material is deposited on the sacrificial layer and patterned by contrast-enhanced photolithography to form a photoresist mold. Upon the mold there is plated a metallic layer of material. The electroplated structure conforms to the resist profile and can have a thickness many times that of polysilicon structures. The photoresist mold and sacrificial layer are thereafter dissolved using etchants to form a free standing metallic structure.

BRIEF DESCRIPTION OF THE DRAWINGS

FIGS. 2A–2M illustrate various stages of construction of the microactuator structure of FIG. 1.

FIG. 4 is a diagrammatic end view of a slider tracking system for a magnetic and/or optical storage device.

FIG. 5 is a diagrammatic side view of a head tracking system for a magnetic and/or optical data storage system.

DETAILED DESCRIPTION OF THE PREFERRED EMBODIMENTS

A method of fabricating miniaturized structures in accordance with the invention will now be described in relation to a preferred embodiment which is exemplary in nature and will be understood as not limiting the scope of the invention, which is defined solely in accordance with the spirit of the claims appended hereto.

Figure 1:
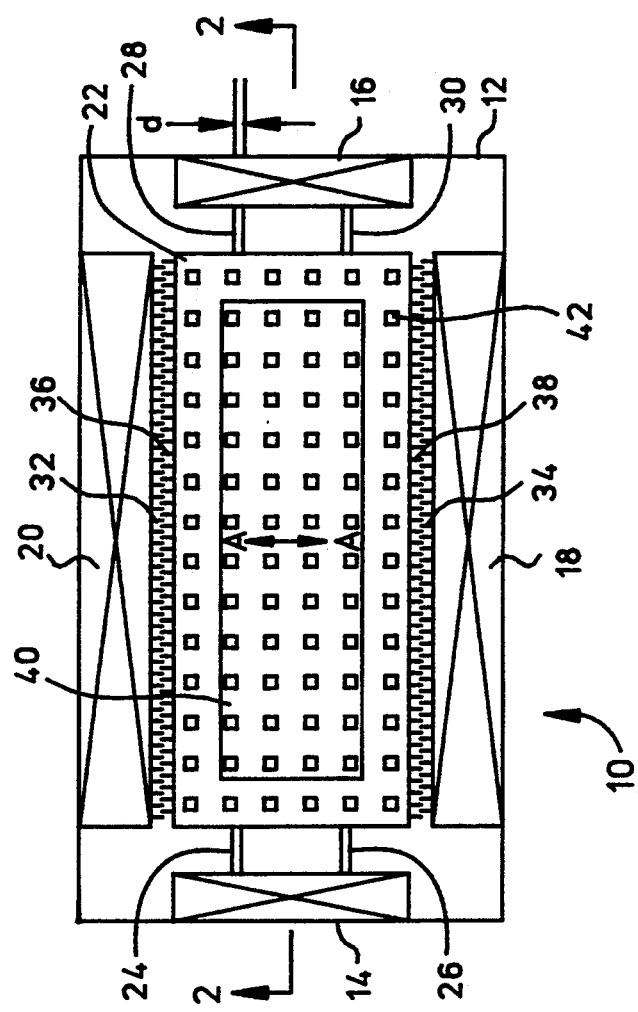
FIG. 1 is a diagrammatic plan view of a microactuator structure fabricated in accordance with the present invention.

In the embodiment of FIG. 1, a miniaturized structure is formed as an electrostatic microactuator device 10. The device 10 includes a substrate 12 having mounted thereon a pair of spaced metallic anchors 14 and 16 disposed at opposing longitudinal ends of the substrate 12, and a pair of spaced metallic stators 18 and 20 formed on the substrate between the anchors 14 and 16 at opposing lateral ends of the substrate 12. There is suspended between the anchors 14 and 16 a free standing metallic actuator 22 which is mounted to the anchors 14 and 16 via a plurality of metallic suspension members 24, 26, 28 and 30. The suspension members are flexible beams joining the actuator 22 to the anchors 14 and 16 so as to allow in-plane movement in the direction of the arrow designated A—A in FIG. 1. In order to facilitate that motion, the thickness of the suspension members 24–30, represented by the dimension "d" in FIG. 1, is relatively thin. Thus, whereas the maximum dimension of the microactuator structure is about 1 millimeter, the thickness "d" is about 1 micrometer. This ensures sufficient suspension flexibility to enable the actuator 22 to be driven in the direction indicated. The driving force used to position the actuator is provided by the stators 18 and 20. Both stators include a plurality of inwardly extending electrodes 32 and 34, respectively. The actuator 22 also includes a plurality of outwardly extending electrodes 36 and 38. The actuator electrodes 36 and 38 are interleaved or "interdigitated" with the stator electrodes 32 and 34, respectively. By application of a DC voltage potential between the stators 18 and 20 and a conductor positioned below the actuator 22 (not shown in FIG. 1), an electrostatic force is generated that causes actuator movement in the direction A—A depending on the polarity of the applied potential, as is conventionally known.

To complete the actuator structure 10, a bonding platform 40 is formed on the top surface of the actuator 22 for bonding components to be driven by the actuator 22. It will be further noted that the actuator 22 includes a plurality of etch holes 42 whose purpose is to let etchant pass through to undercut the sacrificial layer underneath in a final release step, to be described in more detail below.

Figure 2E:
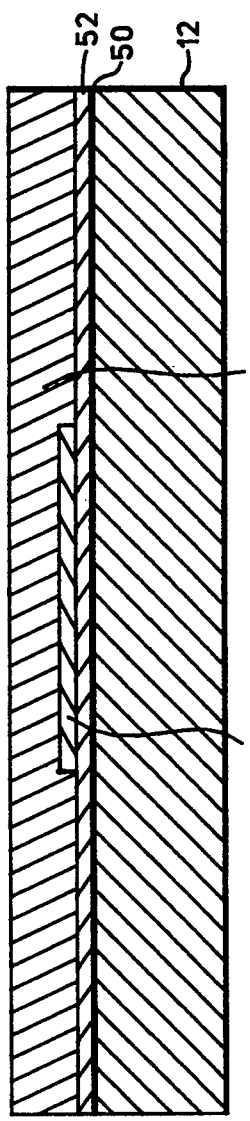

Turning now to FIGS. 2A–2M, a preferred method for fabricating the actuator structure 10 begins as shown in FIG. 2A with an insulated substrate 12 which can be made in conventional fashion from a silicon wafer. The substrate 12 is passivated with silicon dioxide and silicon nitride overcoats 50 and 52, respectively. The thickness of the substrate 12 may vary but is typically around 100 to 500 micrometers. The thickness of the silicon dioxide overcoat is about 5,000 angstroms and the thickness of the silicon nitride overcoat is about 0.5 micrometers. On top of the silicon nitride overcoat 52, there is deposited a thin conducting layer 54 having a thickness of about 0.5 micrometers. The metallic conducting layer 54 could be a doped semiconductor material such as p-type polycrystalline silicon. Alternatively, this layer can be deposited by sputtering a selected metallic composition which may include any of the transition elements including copper or chromium.

Following deposition, the metallic layer 54 is patterned by photolithography and a plasma etching process. As shown in FIG. 2B, a photoresist layer 56 is formed on the metallic layer 54 and a first optical mask 57 is positioned over the photoresist layer. The photoresist material may be of any conventional type. These materials have in common the property that when exposed to an appropriate light source, they become less resistant to subsequent photodevelopment that would dissolve the photoresist material. The mask may be formed from conventional materials such as chrome on quartz. The photoresist layer 56 is irradiated using a collimated light source directed downwardly along an axis which is normal to the plane of the structure. A variety of collimated light sources may be used to expose the photoresist material including light in the ultraviolet region having a wavelength of around 365 nanometers. The exposed resist is developed and hard baked at about 120° F. for approximately one (1) hour. A conventional resist solvent is used to dissolve the exposed resist layer to form a resist pattern as shown in FIG. 2C. Typically, photoresist manufacturers also provide suitable resist solvents that are compatible with the resist material being offered.

The patterned photoresist layer 56 is used for patterning the metallic layer 54 by plasma etching. Carbon tetrachloride ($CCL_4$) plasma etching is preferred. This process removes the portions of the metallic layer 54 that are not protected by the photoresist layer 56. Following the plasma etching process, the photoresist layer 56 is dissolved, yielding a patterned metallic layer 54 as shown in FIG. 2D.

Figure 2F:
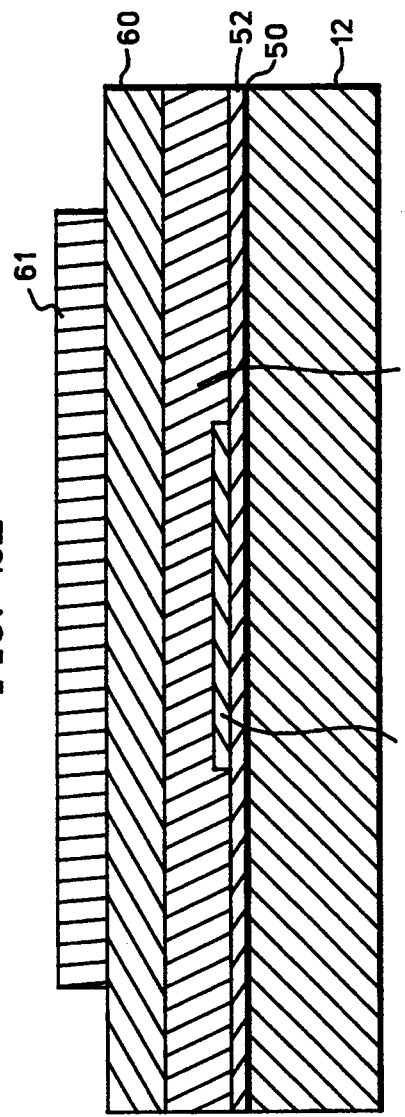
Figure 2G:
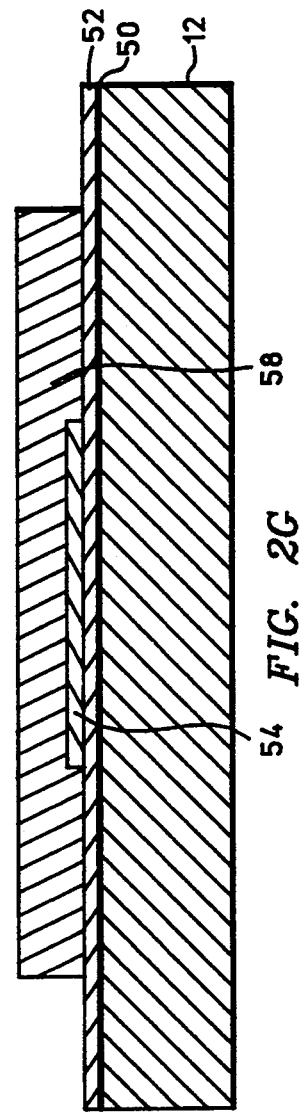

On top of the conducting layer 54 and the silicon nitride overcoat 52, there is deposited a sacrificial layer 58 made from a glass material and preferably phosphosilicate glass or PSG. This construction is illustrated in FIG. 2E. The PSG sacrificial layer is deposited by low pressure chemical vapor deposition (LPCVD) or plasma enhanced chemical vapor deposition (PECVD). Following deposition, the sacrificial layer 58 is patterned into a plate form that will be used to define the interior dimensions of the anchors 14 and 16 and the stators 18 and 20. As shown in FIG. 2F, the sacrificial layer 58 is coated with a photoresist layer 60 and patterned by conventional photolithography using a second optical mask 61 placed over the photoresist and sacrificial layers, followed by irradiating the photoresist and sacrificial layers using a collimated light source directed downwardly along an axis which is normal to the plane of the structure. Again, for this purpose, any conventional photoresist material and any conventional mask material, such as chrome on quartz, can be used. A variety of collimated light sources may also be used to expose the photoresist material including light in the ultraviolet region having a wavelength of around 365 nanometers. The exposed resist is developed and hard baked at about 120° F. for approximately one (1) hour. A hydrogen-fluoride (HF)-based solution such as hydrofluoric acid is used to dissolve the exposed PSG layer. Finally, the remaining photoresist is dissolved in a resist solvent to yield a patterned sacrificial layer 58 as shown in FIG. 2G.

On top of the sacrificial layer 58 and the silicon nitride layer 52, an electroplating seed layer (not shown) is deposited by sputtering. The plating seed layer can be formed from one of the metallic elements and is preferably made from copper, nickel or chromium. Once the plating seed layer is deposited, a photoresist layer 62 is deposited over the seed layer, as shown in FIG. 2H. The photoresist layer 62 extends over the entire footprint of the substrate 12 with the sacrificial layer 58 being disposed centrally underneath. The thickness of the photoresist layer 62 will determine the thickness of the metallic components including the anchor members 14 and 16, the stators 18 and 20, and the actuator 22. Thus, for example, the photoresist layer 62 may be on the order of about 10 micrometers thick or in a range of 10 to 20 micrometers thick. Preferably, the photoresist layer 62 is not less than about 2 micrometers in thickness. The photoresist layer 62 may be formed from conventional photoresist materials including products sold under the brand names AZ 4000 and AZ 6000.

The photoresist material is spun on the structure in conventional fashion. Thereafter, as shown in FIG. 2H, a barrier layer 64 which can be made from soap material or the like is spun on the photoresist layer. A contrast enhancement layer 66 is then spun on the barrier layer 64. The contrast enhancement layer 66 is used to provide sharp optical contrast during subsequent photolithography in order to develop very sharp-edged, straight side wall surfaces in the photoresist layer. This results in a form of contrast-enhanced lithographic structure. The contrast enhancement layer 66 is preferably made from one or more bleachable dyes having, for example, diaryl nittones therein. The expression "bleachable dye" refers to the fact that the contrast enhancement layer becomes transparent when exposed to radiation from a photolithographic optical source above a critical energy level and remains opaque at lower radiant energies. The contrast enhancement layer functions as an optical switch which, upon activation, allows photodevelopment of the photoresist material below. This facilitates uniform photodevelopment of the underlying photoresist material so that upper portions are not overexposed while lower portions remain underexposed. A preferred contrast enhancement material is available from General Electric Corporation under the trademark "CEM 388". The critical energy level will vary with the thickness of the photoresist and the contrast enhancement layer.

Referring now to FIG. 2I, a third optical mask 67 is used to pattern the photoresist layer 62, the barrier layer 64 and the contrast enhancement layer 66 to form a mold for subsequent electroplating. The third optical mask 67 can be made conventionally from chrome on quartz, with the photoresist layer 62, the barrier layer 64 and the contrast enhancement layer 66 serving as a composite positive photoresist layer. By appropriate radiation exposure and selective resist hardening, exposed areas of the composite photoresist layer are dissolved by subsequent photo development while portions of the resist underneath the third optical mask 67 remain intact. The radiation source of choice for patterning the composite photoresist layer is a low numerical aperture (NA) projection system. The system provides highly collimated radiation in the ultraviolet region and preferably at a wavelength of about 365 nanometers directed substantially normal to the plane of the structure. The exposed resist is thereafter developed but is not hard baked.

Figure 2K:
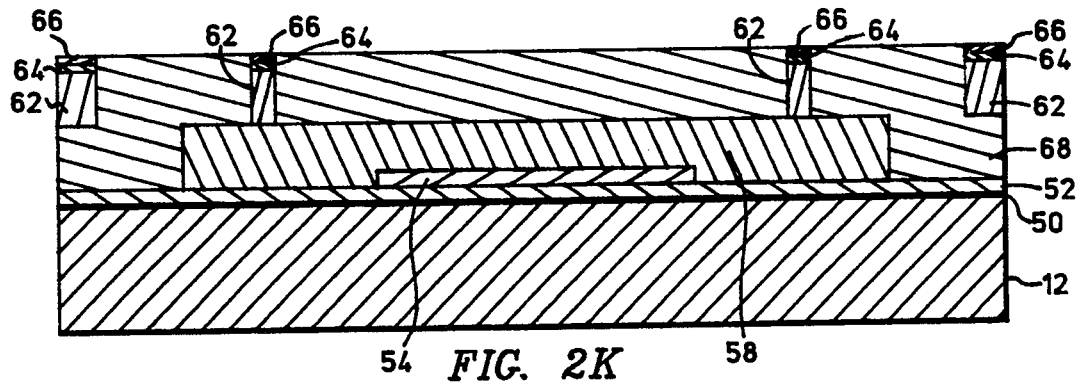

The patterning of the composite photoresist layer yields a mold structure, illustrated in FIG. 2J, that defines the shape and configuration of the metallic anchors 14 and 16, the actuator 22 and the stators 18 and 20, shown in FIG. 1. Moreover, the plural etch holes 42 are defined. Using the described photolithographic patterning process, photoresist stencils or molds up to 20 $\mu$m thick, with aspect ratios of 9:1 to 10:1 and even higher can be readily achieved, thus permitting the development of metallic structures that are fairly thick in the out-of-plane direction (relative to FIG. 1) while allowing very thin features, such as the spacing of the interleaved electrodes, to be formed in the plane of the structure. With the photoresist formed in the manner described, a metallic structure 68 can be deposited as shown in FIG. 2K by electroplating using the plating seed layer as an electroplating electrode. The plating material can be any of the metallic elements and is preferably a transition element such as copper, nickel or chromium when the sacrificial layer is phosphosilicate glass.

Figure 2L:
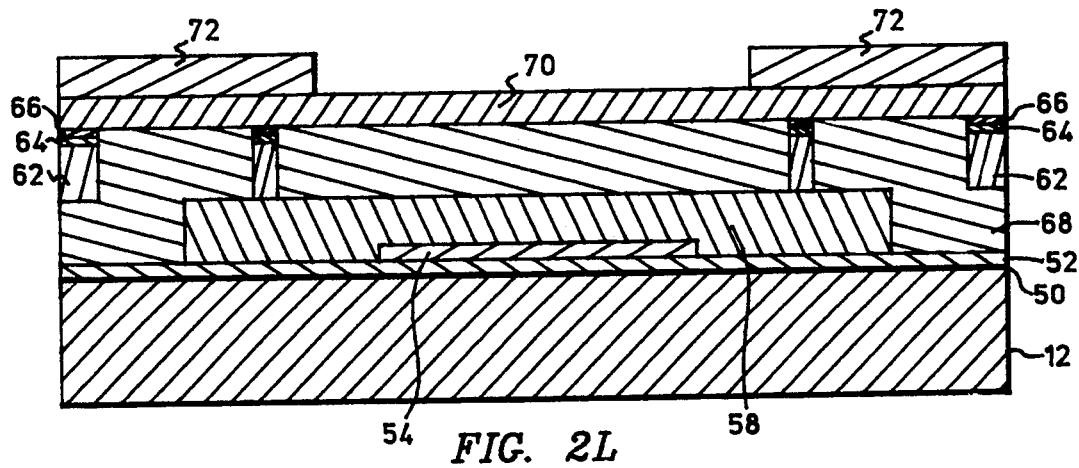
Figure 2M:
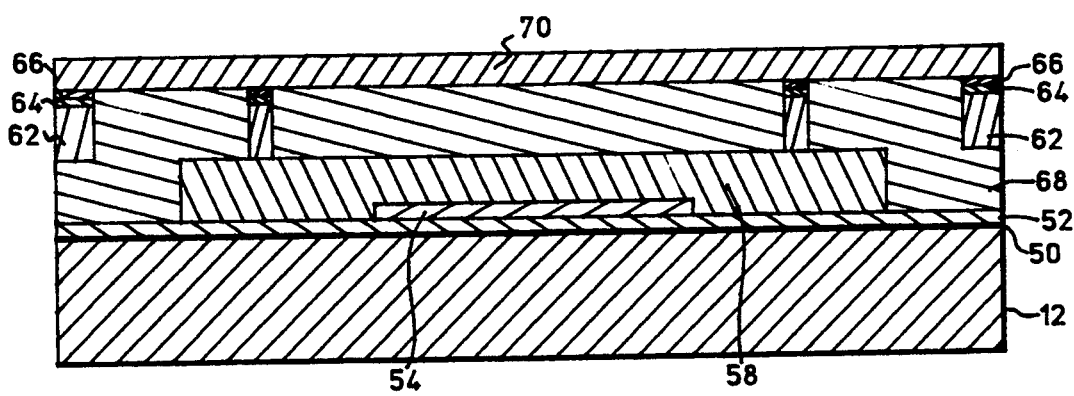

Following the metallic plating step, the bonding platform 40 is created by depositing a photoresist layer 70 on the plated metallic layer 68. The photoresist layer 70 is made from a conventional resist material. A fourth optical mask 72 is placed over the photoresist layer 70. Again, the optical mask is a conventional material such as chrome on quartz. These structures are shown in FIG. 2L. The photoresist layer 70 is exposed to a collimated light source providing light in the ultra-violet region having a wavelength around 365 nanometers. This light is directed downwardly along an axis which is normal to the plane of the structure. The exposed resist is thereafter developed but is not hard baked. The patterned resist is then used as an electroplating mold to form a metal structure 74, as shown in FIG. 2M. This structure forms the bonding platform 40 when the resist layer 70 is dissolved.

Figure 3:
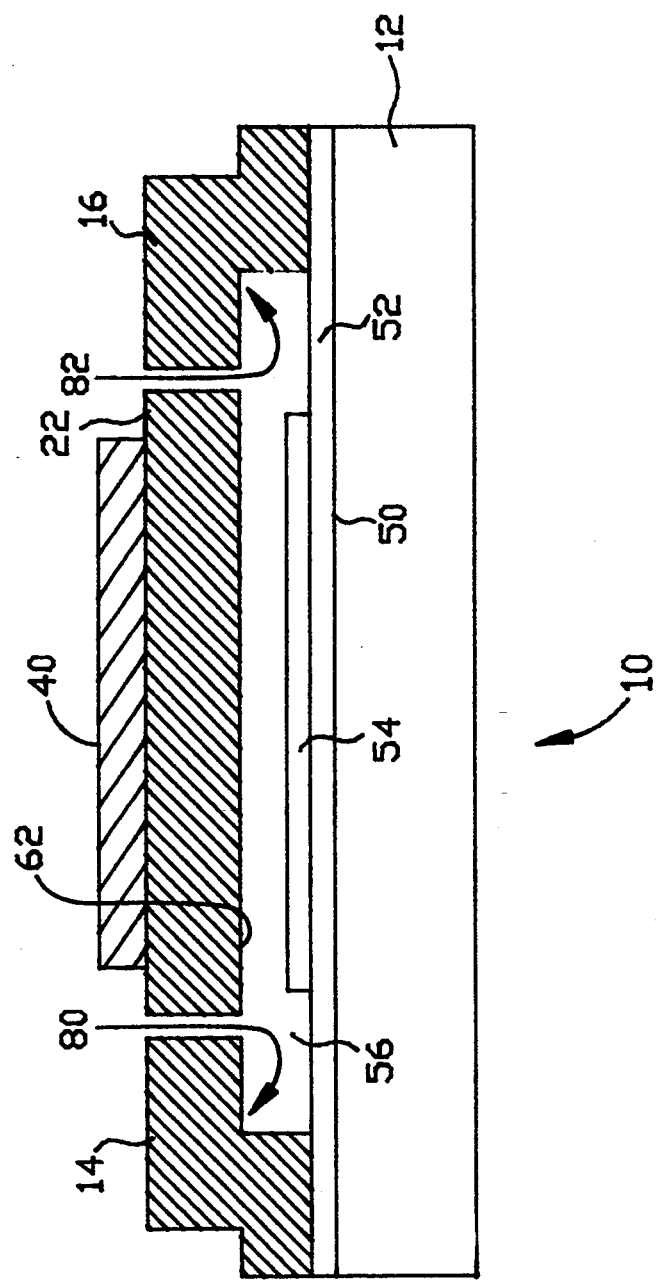
FIG. 3 is a cross-sectional view taken along line 3—3 in FIG. 1.

Following construction of the bonding platform 40, the remaining composite photoresist layer, including the layers 62, 64 and 66, the seed layer and the sacrificial layer 58, are all dissolved to form the metallic anchor structures 14 and 16, the stator structures 18 and 20, and the free standing actuator structure 22, including the suspension members 24–30 and the interleaved electrodes 32–38. A cross-section of this configuration is shown in FIG. 3. The etchant used to dissolve the sacrificial layer 58 is preferably hydrofluoric acid- or any other suitable HF-based solution when the sacrificial layer is made from phosphosilicate glass and the metallic structure 68 is made from copper or chromium. These materials advantageously provide an etch rate of around 1 micrometer per minute or greater in the sacrificial material at room temperature, and a negligible etch rate of the copper or chromium metallic structure. Thus, the hydrogen fluoride-based etchant provides good etching selectively with respect to a PSG sacrificial layer 58 and a Cu or Cr metallic structure 68.

It will be appreciated that structures having high aspect ratios can be conveniently formed using the fabrication method described above. High aspect ratio structures such as the microactuator 10 are expected to have numerous applications wherein it is desirable to minimize vertical or out-of-plane deflection while generating good in-plane actuating forces. For example, high aspect ratio microactuators could be economically used in sub-micrometer tracking for magnetic or optical recording. Examples of this application are illustrated in FIGS. 4 and 5. FIG. 4 illustrates a slider tracking system 100 showing a microactuator 102 constructed in accordance with the invention, sandwiched between a tracking arm suspension assembly 104 and a slider 106 having a pair of magnetic heads 108 and 110 mounted thereon. The microactuator 102 is shown as including a substrate 112, a free standing actuator structure 114 and a bonding platform 116 to which the slider 106 is mounted. The device of FIG. 4 can be constructed to have large vertical stiffness (40 kN/m) and 1 mN force yielding a 1.6 kHZ bandwidth for 1 micrometer tracking with a 10 milligram load.

An alternative construction for a head tracking system 120 is illustrated in FIG. 5. A slider 122 is shown as having a lower air bearing surface 124. A thin film head 126 is mounted to the slider 122 via a microactuator structure 128 constructed in accordance with the present invention. Again, extremely fine tracking corrections are provided by the microactuator 128.

Figure 6:
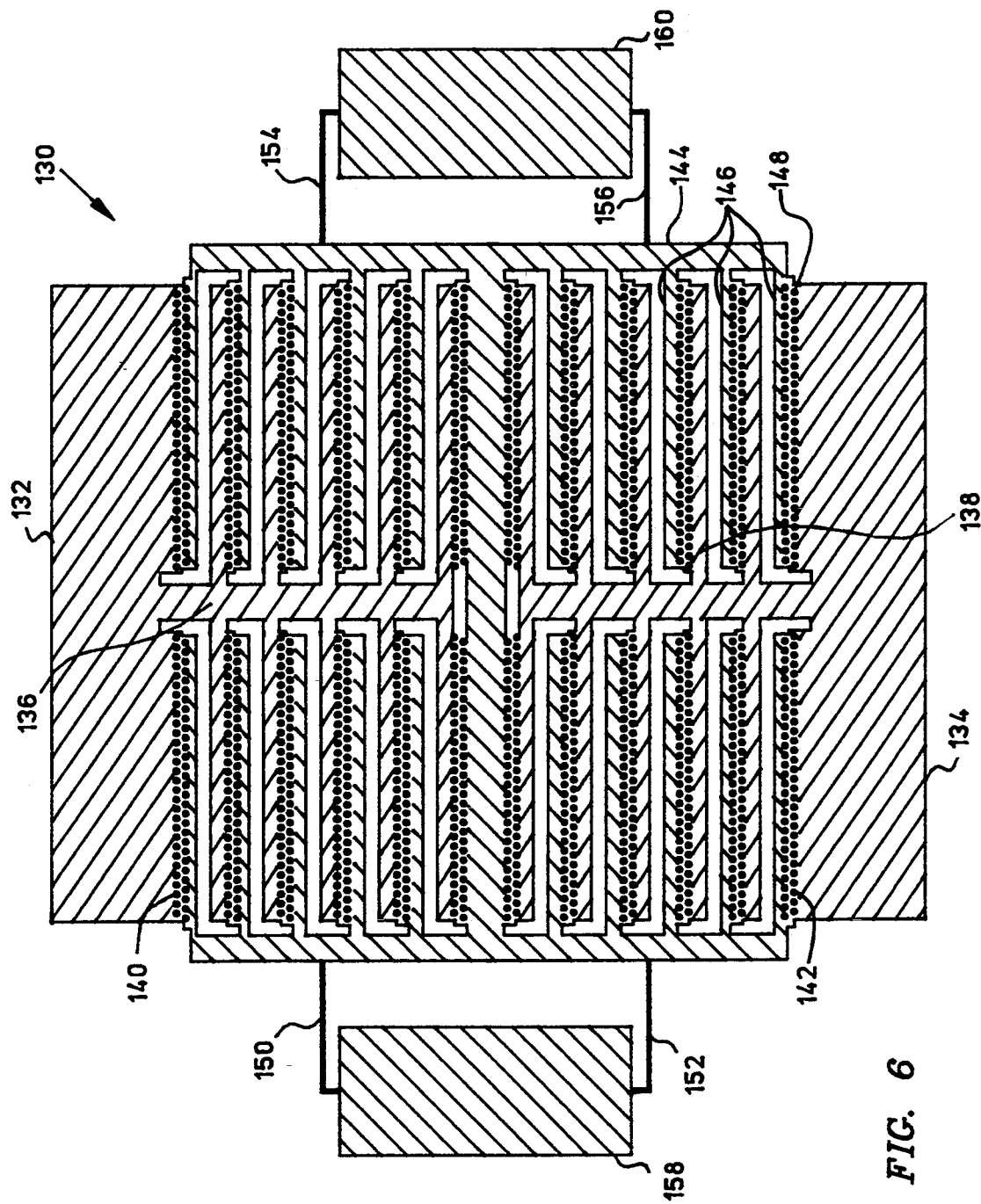
FIG. 6 is a diagrammatic plan view of an area-efficient multi-electrode microactuator system constructed based on the present invention.
Figure 7:
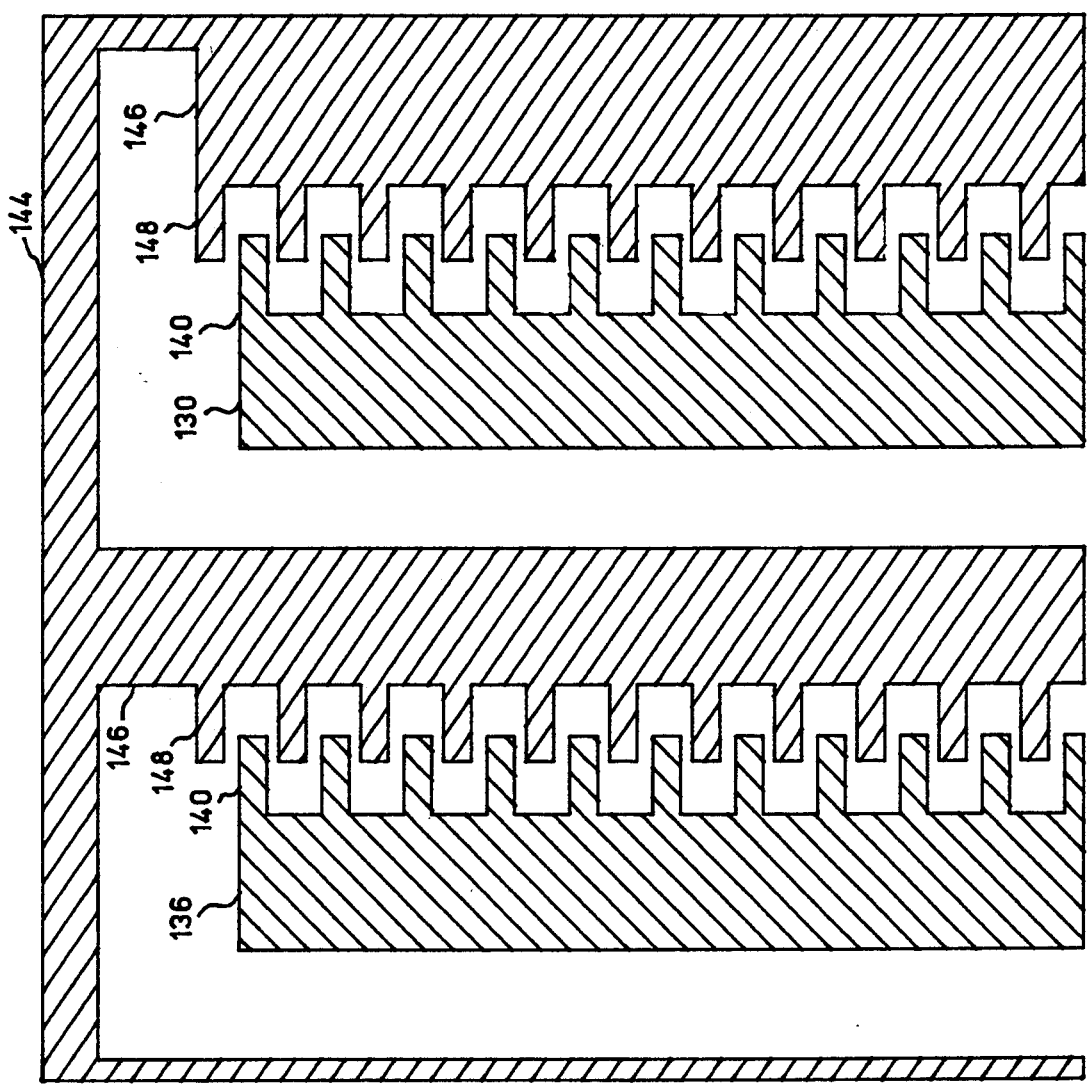
FIG. 7 is a detailed view of a portion of the area-efficient microactuator of FIG. 6.

FIGS. 6 and 7 illustrate a preferred microactuator construction for developing in-plane actuating forces, in this case, an area-efficient, multi-electrode microactuator structure 130. This electrode tree structure includes a pair of stators 132 and 134 each having multiple branches 136 and 138, respectively. Each branch in turn has plural fingers 140 and 142 extending laterally outwardly therefrom as more clearly shown in FIG. 7. The tree structure further includes an actuator 144 having plural branches 146 each having plural electrode fingers 148 extending laterally therefrom, as also illustrated in FIG. 7. The actuator 144 is mounted by plural suspension members 150, 152, 154 and 156 to a pair of anchor structures 158 and 160. In this approach, each pair of fingers forms an energy conversion cell which popularizes the whole area and efficiently converts electrical field energy into force or torque and maintains a constant output versus input relation within a small operational range. It is estimated that if the structure of FIGS. 6 and 7 is sized to encompass an area of 1 millimeter by 1 millimeter with an out-of-plane thickness of 20 micrometers, electrodes having a width of 6 micrometers, with 2 micrometer air gaps, a 10 micrometer branch width, a branch separation of 25 micrometers for the interdigitated fingers, and 5 micrometers otherwise, and a maximum voltage of 100 volts, a lateral force of 1.1 milli-Newtons could be achieved. For structural integrity, the electrode tree structure 130 could be provided with a top plate to hold all of the movable actuator electrode branches together. The plate could be either metal or formed from a process-compatible dielectric material. Assuming a 5 micrometer separation between the plate and stator electrode branches, it is estimated that a small vertical force of 0.3 milli-Newtons would result. The vertical stiffness, being at least three orders of magnitude larger than a comparable structure made from polysilicon, should be able to accommodate this load with minimal out of plane deflection.

Accordingly, micro-miniaturized structures and a method of fabrication thereof are disclosed. While several preferred embodiments of the invention have been shown and described, it should be understood that modifications and adaptations thereof will occur to persons skilled in the art. Therefore, the protection afforded the invention should not be limited except in accordance with the spirit of the following claims and their equivalents.

We claim:

1. A method for fabricating a method, comprising the steps of:
    selecting a substrate material;
    depositing on the substrate material a sacrificial layer of material;
    patterning the sacrificial layer to define a shape;
    depositing on the sacrificial layer a photoresist layer of material;
    patterning the photoresist layer by contrast-enhanced photolithography to form a photoresist mold;
    plating a metallic layer of material on the photoresist mold, said photoresist layer being patterned to provide a free standing metallic structure having an aspect ratio of at least 9:1; and
    dissolving the photoresist mold and the sacrificial layer using etchants to form a free standing metallic structure.

2. The method of claim 1 wherein the sacrificial layer, the metallic layer and the etchants are chosen to provide high etching selectivity so as to etch the sacrificial layer at a substantially higher rate than the metallic layer.

3. The method of claim 1 wherein the sacrificial layer is formed from a glass material, the metallic layer is formed from a transition element and the etchant is made from an HF-based acid material.

4. The method of claim 1 wherein the sacrificial layer is phosphosilicate glass (PSG), the metallic layer is copper or chromium and the etchant is hydrofluoric acid (HF).

5. The method of claim 4 wherein the contrast enhancement layer is formed from a composition having a bleachable dye therein.

6. The method of claim 1 wherein the step of depositing a photoresist layer further includes the step of depositing a contrast enhancement layer on the photoresist layer.

7. The method of claim 1 wherein the step of depositing a photoresist layer further includes the step of depositing a barrier layer on the photoresist layer and a contrast enhancement layer on the barrier layer.

8. The method of claim 1 wherein the step of patterning the photoresist layer includes masking the photoresist layer and exposing unmasked portions of the photoresist layer using a low numerical aperture projection system providing a source of collimated radiation having a wavelength of about 0.365 $\mu$m.

9. The method of claim 1 wherein the photoresist layer is formed at a thickness of not less than about 2 $\mu$m.

10. The method of claim 1 wherein the photoresist layer is patterned to provide a free standing structure having a vertical thickness of up to about 20 micrometers.

11. A method for fabricating methods having a substrate material and a free standing metallic structure positioned above the substrate, said structure being formed by the steps of:
    selecting a substrate material;
    depositing on the substrate material a sacrificial layer of material;
    patterning the sacrificial layer to define a shape;
    depositing on the sacrificial layer a photoresist layer of material;
    patterning the photoresist layer by contrast-enhanced photolithography to form a photoresist mold having one or more substantially vertical sidewalls, including masking the photoresist layer and exposing unmasked portions of the photoresist layer using a source of collimated radiation having a wavelength of about 365 nanometer, and thereafter photodeveloping the photoresist layer to remove the unmasked portions of the photoresist layer;

electro-plating a metallic layer of material on the photoresist mold, said photoresist layer being patterned to provide a free standing metallic structure having an aspect ratio of at least 9:1; and dissolving the photoresist mold and the sacrificial layer using etchants to form a free standing metallic structure.

12. The method of claim 11 wherein the sacrificial layer, the metallic layer and the etchant are chosen to provide high etching selectivity so as to etch the sacrificial layer at a substantially higher rate than the metallic layer.

13. The method of claim 11 wherein the sacrificial layer is formed from a glass material, the metallic layer is formed from a transition element and the etchant is made from an acid material.

14. The method of claim 11 wherein the sacrificial layer is phosphosilicate glass (PSG), the metallic layer is copper or chromium and the etchant is hydrofluoric acid (HF).

15. The method of claim 14 wherein the contrast enhancement layer is formed from a composition having a bleachable dye therein.

16. The method of claim 11 wherein the step of depositing a photoresist layer further includes the step of depositing a contrast enhancement layer on the photoresist layer.

17. The method of claim 11 wherein the step of depositing a photoresist layer further includes the step of depositing a barrier layer on the photoresist layer and a contrast enhancement layer on the barrier layer.

18. The method of claim 11 wherein the photoresist layer is formed at a thickness of not less than about 2 $\mu$m.

19. A method for fabricating miniaturized structures having a substrate material and a free standing metallic structure positioned above the substrate, said structure being formed by the steps of:

selecting a substrate material;

depositing on the substrate material a sacrificial layer of material;

patterning the sacrificial layer to define a shape;

depositing on the sacrificial layer a photoresist layer of material;

patterning the photoresist layer by contrast-enhanced photolithography to form a photoresist mold;

plating a metallic layer of material on the photoresist mold, said photoresist layer being patterned to provide a free standing structure having an aspect ratio of at least 9:1 and a vertical thickness between about 2–20 micrometers; and dissolving the photoresist mold and the sacrificial layer using etchants to form a free standing metallic structure.

* * * * *

UNITED STATES PATENT AND TRADEMARK OFFICE
CERTIFICATE OF CORRECTION

PATENT NO. : 5,364,742
DATED : November 15, 1994
INVENTOR(S) : Fan et al

It is certified that error appears in the above-indentified patent and that said Letters Patent is hereby corrected as shown below:

<u>Col. 7, line 67:</u>

Claim 1, line 1, please change "fabricating a method" to --fabricating a miniaturized structure--

<u>Col. 8, line 52:</u>

Claim 11, line 1, please change "fabricating methods" to --fabricating miniaturized structures--

Signed and Sealed this

Second Day of May, 1995

Attest:

BRUCE LEHMAN

Attesting Officer

Commissioner of Patents and Trademarks